(12) United States Patent
Tanaka et al.

(10) Patent No.: US 9,401,498 B2
(45) Date of Patent: Jul. 26, 2016

(54) LIGHT-EMITTING DEVICE, LIGHTING DEVICE, SUBSTRATE, AND MANUFACTURING METHOD OF SUBSTRATE

(75) Inventors: Koichiro Tanaka, Kanagawa (JP); Yusuke Nishido, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 369 days.

(21) Appl. No.: 13/409,889

(22) Filed: Mar. 1, 2012

(65) Prior Publication Data
US 2012/0223350 A1 Sep. 6, 2012

(30) Foreign Application Priority Data
Mar. 4, 2011 (JP) .................. 2011-047652

(51) Int. Cl.
*H01L 29/08* (2006.01)
*H01L 51/52* (2006.01)
(Continued)

(52) U.S. Cl.
CPC .......... *H01L 51/5275* (2013.01); *B32B 17/064* (2013.01); *H01L 51/0097* (2013.01); *H01L 51/5253* (2013.01); *H01L 2251/5338* (2013.01); *Y02E 10/549* (2013.01); *Y02P 70/521* (2015.11); *Y10T 428/24331* (2015.01)

(58) Field of Classification Search
CPC ............ H01L 51/0097; H01L 51/5253; H01L 51/5275
USPC ...................................... 257/40, 98
See application file for complete search history.

(56) References Cited

U.S. PATENT DOCUMENTS

| 5,107,175 A | 4/1992 | Hirano et al. |
|---|---|---|
| 5,124,204 A | 6/1992 | Yamashita et al. |

(Continued)

FOREIGN PATENT DOCUMENTS

| JP | 7-65950 | 3/1995 |
|---|---|---|
| JP | 8-248207 | 9/1996 |

(Continued)

OTHER PUBLICATIONS

Kim, G.H. et al, "Thin Film Passivation for Longevity of Organic Light-Emitting Devices and Organic Thin-Film Transistor," IDW '03: Proceedings of the 10$^{th}$ International Display Workshops, Dec. 3, 2003, pp. 387-390.

*Primary Examiner* — Mark Tornow
(74) *Attorney, Agent, or Firm* — Husch Blackwell LLP

(57) ABSTRACT

To provide a substrate which is light and has high reliability and high light extraction efficiency from an organic EL element. To provide a substrate which includes a protective layer in a resin layer, an uneven structure on a light incident surface, and an opening which surrounds the uneven structure and through which the protective layer is exposed. To provide a light-emitting device which includes a resin layer provided with an uneven structure on a light incident surface over a protective layer, and a light-emitting element in the protective layer and a counter substrate which are bonded with a sealant. The protective layer and the resin layer have a property of transmitting visible light. The light-emitting element includes a light-transmitting first electrode over a resin layer, a layer containing a light-transmitting organic compound over the first electrode, and a second electrode over the layer containing a light-transmitting organic compound.

14 Claims, 11 Drawing Sheets

(51) Int. Cl.
*H01L 51/00* (2006.01)
*B32B 17/06* (2006.01)

(56) References Cited

U.S. PATENT DOCUMENTS

| | | | |
|---|---|---|---|
| 5,189,405 A | 2/1993 | Yamashita et al. |
| 5,686,360 A | 11/1997 | Harvey, III et al. |
| 5,693,956 A | 12/1997 | Shi et al. |
| 5,757,126 A | 5/1998 | Harvey, III et al. |
| 5,771,562 A | 6/1998 | Harvey, III et al. |
| 5,811,177 A | 9/1998 | Shi et al. |
| 5,952,778 A | 9/1999 | Haskal et al. |
| 6,146,225 A | 11/2000 | Sheats et al. |
| 6,150,187 A | 11/2000 | Zyung et al. |
| 6,198,217 B1 | 3/2001 | Suzuki et al. |
| 6,198,220 B1 | 3/2001 | Jones et al. |
| 6,268,695 B1 | 7/2001 | Affinito |
| 6,413,645 B1 | 7/2002 | Graff et al. |
| 6,771,021 B2 | 8/2004 | Cok |
| 6,965,195 B2 | 11/2005 | Yamazaki et al. |
| 7,663,312 B2 | 2/2010 | Anandan |
| 7,755,097 B2 | 7/2010 | Kim |
| 8,003,993 B2 | 8/2011 | Cho et al. |
| 8,004,003 B2 | 8/2011 | Kim |
| 2001/0035713 A1 | 11/2001 | Kimura |
| 2004/0149987 A1* | 8/2004 | Kim et al. ............ 257/49 |
| 2004/0217702 A1 | 11/2004 | Garner et al. |
| 2005/0199599 A1 | 9/2005 | Li et al. |
| 2006/0237735 A1 | 10/2006 | Naulin et al. |
| 2007/0172971 A1* | 7/2007 | Boroson ............... 438/26 |
| 2007/0222372 A1 | 9/2007 | Cok et al. |
| 2008/0018231 A1 | 1/2008 | Hirakata |
| 2008/0121918 A1 | 5/2008 | DenBaars et al. |
| 2008/0213931 A1 | 9/2008 | Asabe |
| 2009/0073681 A1* | 3/2009 | Chen ................... 362/218 |
| 2009/0302744 A1* | 12/2009 | Kim et al. ............ 313/504 |
| 2010/0013372 A1 | 1/2010 | Oikawa et al. |
| 2010/0090234 A1 | 4/2010 | Cho et al. |
| 2010/0110551 A1 | 5/2010 | Lamansky et al. |
| 2010/0295443 A1 | 11/2010 | Roberts et al. |
| 2011/0147777 A1 | 6/2011 | Konno et al. |
| 2012/0099323 A1* | 4/2012 | Thompson ............ 362/257 |

FOREIGN PATENT DOCUMENTS

| | | |
|---|---|---|
| JP | 2003-086353 A | 3/2003 |
| JP | 2004-022438 A | 1/2004 |
| JP | 2006-147203 | 6/2006 |
| JP | 2008-112592 A | 5/2008 |

* cited by examiner

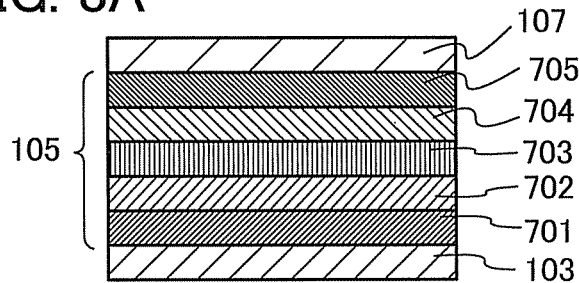
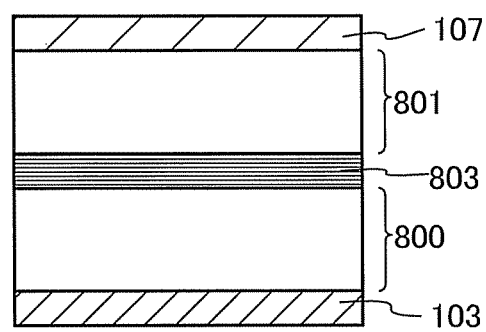
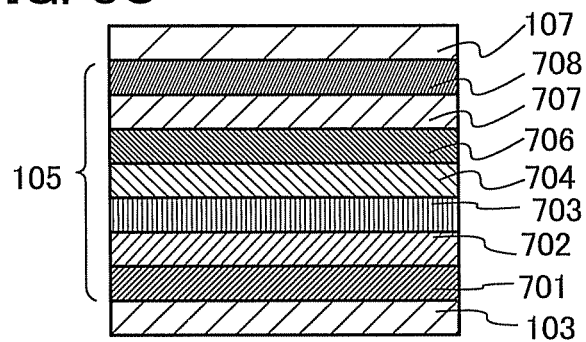

LIGHT-EMITTING DEVICE, LIGHTING DEVICE, SUBSTRATE, AND MANUFACTURING METHOD OF SUBSTRATE

BACKGROUND OF THE INVENTION

1. Field of the Invention

The present invention relates to a light-emitting device including a light-emitting element utilizing an organic electroluminescence (EL) phenomenon (hereinafter also referred to as an organic EL element). The present invention also relates to a substrate used for the light-emitting device.

2. Description of the Related Art

An organic EL element has been actively researched and developed. In a basic structure of an organic EL element, a layer containing a light-emitting organic compound (hereinafter also referred to as a light-emitting layer) is sandwiched between a pair of electrodes. By applying voltage to this element, light emission from the light-emitting organic compound can be obtained.

The organic EL element can be formed into a film; thus, a large-area element can be easily formed. Therefore, the organic EL element has a high utility value as a surface light source that can be applied to lighting or the like.

The organic EL element emits light in a region with a refractive index higher than that of the air; thus, when light is extracted to the air, total reflection occurs in the element or at the interface between the element and the air under a certain condition, which results in a light extraction efficiency of lower than 100%. It is generally said that the light extraction efficiency of the element is approximately 20% to 30%.

Patent Document 1 discloses a structure of an EL device provided with a light extraction layer, in which a lens for refracting light emitted from a light-emitting layer is embedded, between a transparent electrode and a transparent substrate. With such a structure, a reduction in light extraction efficiency due to total reflection at the interface between the transparent electrode and the transparent substrate can be suppressed.

Non-Patent Document 1 discloses a light-emitting device in which an organic EL element is provided over a plastic substrate. A light-emitting device including a plastic substrate can be made light compared to the one including a glass substrate or the like.

REFERENCE

Patent Document

[Patent Document 1] Japanese Published Patent Application No. 2006-147203

Non-Patent Document

[Non-Patent Document 1] Gi Heon Kim et al., "THIN FILM PASSIVATION FOR LONGEVITY OF ORGANIC LIGHT-EMITTING DEVICES AND ORGANIC", IDW'03, 2003, pp. 387-390

SUMMARY OF THE INVENTION

An organic EL element has a problem in that the reliability is lost (e.g., a reduction in light emission efficiency) by entry of an impurity.

When moisture or an impurity, enters an organic compound or a metal material contained in an organic EL element from the outside of the organic EL element, the lifetime of the organic EL element is drastically shortened in some cases. This is because an organic compound or a metal material contained in the organic EL element reacts with moisture or an impurity and deteriorates.

A plastic substrate such as that used in Non-Patent Document 1 easily transmits moisture or an impurity. Therefore, entry of moisture, oxygen, an impurity, or the like from the side where the plastic substrate is used adversely affects the lifetime of the organic EL element and the light-emitting device in some cases.

In view of the above, an object of one embodiment of the present invention is to provide a highly reliable substrate which is light and has high light extraction efficiency from an organic EL element. Another object is to provide a method for manufacturing the substrate.

Another object is to provide a light-emitting device or a lighting device which is light and has high reliability and high light extraction efficiency from an organic EL element.

In order to achieve any of the above objects, in one embodiment of the present invention, a substrate in which a resin and a material having a high barrier property are combined is used for a light-emitting device.

Specifically, according to one embodiment of the present invention, a light-emitting device includes a resin layer provided with an uneven structure on a light incident surface over a protective layer, and a light-emitting element in space between the protective layer and a counter substrate which are bonded to each other with a sealant. The protective layer and the resin layer have a property of transmitting visible light (hereinafter simply referred to as a light-transmitting property). The light-emitting element includes a first electrode having a light-transmitting property over the resin layer, a layer containing an organic compound having a light-emitting property (also referred to as a light-emitting layer) over the first electrode, and a second electrode over the layer containing an organic compound having a light-emitting property.

Since a resin material is used for the substrate (including the resin layer and the protective layer) in one embodiment of the present invention, the light-emitting device can be reduced in weight as compared to the case where a substrate of only glass with the same size and thickness is used. According to one embodiment of the present invention, a flexible light-emitting device can be obtained.

According to one embodiment of the present invention, an uneven structure is provided between the organic EL element (first electrode) and the resin layer. With such a structure, a reduction in light extraction efficiency due to total reflection at the interface between the first electrode and the resin layer can be suppressed.

Since the protective layer is provided in one embodiment of the present invention, moisture, an impurity, or the like can be prevented from entering an organic compound or a metal material contained in the light-emitting element from the outside of the light-emitting device. Further, in the light-emitting device of one embodiment of the present invention, the light-emitting element is sealed with the protective layer, the counter substrate, and the sealant; therefore, moisture, an impurity, or the like can be prevented from entering the organic compound or the metal material contained in the light-emitting element not only on a light-emitting surface but also on a side surface of the light-emitting device. Thus, a highly reliable light-emitting device can be obtained.

Note that in this specification, a light incident surface or a light-emitting surface of a layer refers to an incident surface or an emission surface of light emitted from a light-emitting element of a light-emitting device of one embodiment of the present invention.

According to another embodiment of the present invention, a light-emitting device includes a first resin layer, a protective layer over the first resin layer, a second resin layer over the protective layer, and a light-emitting element in space between the protective layer and a counter substrate which are bonded to each other with a sealant. The first resin layer, the protective layer, and the second resin layer have a light-transmitting property. The first resin layer includes a first uneven structure on a light-emitting surface, and the second resin layer includes a second uneven structure on a light incident surface. The light-emitting element includes a first electrode having a light-transmitting property over the second resin layer, a layer containing an organic compound having a light-emitting property over the first electrode, and a second electrode over the layer containing an organic compound having a light-emitting property.

Since a resin material is used for the substrate in one embodiment of the present invention, the light-emitting device can be reduced in weight as compared to the case where a glass substrate is used.

According to one embodiment of the present invention, an uneven structure is provided between the organic EL element (first electrode) and the second resin layer. Further, an uneven structure is provided at the interface between the first resin layer and the air. With such a structure, a reduction in light extraction efficiency due to total reflection at the interface between the first electrode and the second resin layer and total reflection at the interface between the first resin layer and the air can be suppressed.

Since the protective layer is provided in one embodiment of the present invention, moisture, an impurity, or the like can be prevented from entering an organic compound or a metal material contained in the light-emitting element from the outside of the light-emitting device. Further, in the light-emitting device of one embodiment of the present invention, the light-emitting element is sealed with the protective layer, the counter substrate, and the sealant; therefore, moisture, an impurity, or the like can be prevented from entering the organic compound or the metal material contained in the light-emitting element not only on a light-emitting surface but also on a side surface of the light-emitting device. Thus, a highly reliable light-emitting device can be obtained.

In the organic EL element used for the above light-emitting device, when the first electrode is uneven, leakage current might be generated in the light-emitting layer or the like formed over the first electrode. For that reason, in a light-emitting device of one embodiment of the present invention, a planarization layer is provided over a resin layer (or a second resin layer), and a light-emitting element is provided over the planarization layer. The refractive index of the planarization layer is greater than or equal to 1.6. It is preferably greater than or equal to the refractive index of an EL layer (including at least the light-emitting layer) included in the organic EL element. With such a structure, formation of unevenness over the first electrode due to the uneven structure included in the resin layer (or the second resin layer) can be suppressed and generation of leakage current in the light-emitting layer or the like can be prevented.

Since the difference in refractive index between the organic EL element and the planarization layer is small, total reflection hardly occurs. In addition, the uneven structure is provided at the interface between the resin layer (second resin layer) and the planarization layer; therefore, even when the resin layer (second resin layer) and the planarization layer have different refractive indexes, a reduction in light extraction efficiency due to total reflection at the interface can be suppressed.

In a light-emitting device of one embodiment of the present invention to which the above substrate with a combination of a resin and a material having a high barrier property (substrate including the resin layer and the protective layer) is applied, the case where the adhesion between a resin used for the resin layer and a material for the protective layer (e.g., glass) is low is considered.

Therefore, according to one embodiment of the present invention, a substrate includes a protective layer in a resin layer, an uneven structure on a light incident surface, and an opening which surrounds the uneven structure and through which the protective layer is exposed.

According to one embodiment of the present invention, a substrate includes a protective layer in a resin layer, a first uneven structure on a light-emitting surface, a second uneven structure on a light incident surface, and an opening which surrounds the second uneven structure and through which the protective layer is exposed.

In any of the above structures, the protective layer is covered with the resin layer; thus, the protective layer and the resin layer are hardly peeled off. In addition, the mechanical strength of the substrate can be increased.

One embodiment of the present invention is a light-emitting device including the above substrate and an organic EL element. The light-emitting device further includes a light-emitting element in space between the protective layer and a counter substrate which are bonded to each other with a sealant. The light-emitting element includes a first electrode having a light-transmitting property over a resin layer, a layer containing an organic compound having a light-emitting property over the first electrode, and a second electrode over the layer containing an organic compound having a light-emitting property.

Since the protective layer is provided in the resin layer in one embodiment of the present invention, moisture, an impurity, or the like can be prevented from entering an organic compound or a metal material contained in the light-emitting element from the outside of the light-emitting device. An opening which surrounds the uneven structure and through which the protective layer is exposed is also provided. In the opening, the protective layer and the counter substrate are bonded to each other with the sealant; therefore, moisture, an impurity, or the like can be prevented from entering the organic compound or the metal material contained in the light-emitting element not only on a light-emitting surface but also on a side surface of the light-emitting device.

Since the protective layer in a region other than the opening is covered with the resin layer, the adhesion between the protective layer and the resin layer is high; therefore, a resin which has low adhesion with a material used for the protective layer also can be used. Further, by a method for manufacturing a substrate of one embodiment of the present invention described below, a substrate with high adhesion between the protective layer and the resin layer can be easily manufactured. An adhesive or the like may be used as appropriate.

In the above light-emitting device, it is preferable that a planarization layer be provided over the second uneven structure and the light-emitting element be provided over the planarization layer. The refractive index of the planarization layer is greater than or equal to 1.6. It is preferably greater than or equal to the refractive index of an EL layer included in the organic EL element. With such a structure, formation of unevenness over the first electrode due to the second uneven structure can be suppressed and generation of leakage current in a light-emitting layer or the like can be prevented.

Since the difference in refractive index between the organic EL element and the planarization layer is small, total reflection hardly occurs. In addition, the uneven structure is provided at the interface between the resin layer and the planarization layer; therefore, even when the resin layer and the planarization layer have different refractive indexes, a reduction in light extraction efficiency due to total reflection at the interface can be suppressed.

One embodiment of the present invention is a method for manufacturing the substrate including the steps of: forming a first resin layer, a protective layer, and a second resin layer over a first mold in this order; providing a second mold over the second resin layer; and applying heat and pressure with the first resin layer, the protective layer, and the second resin layer sandwiched between the first mold and the second mold.

One embodiment of the present invention is a method for manufacturing a substrate including the steps of: forming a first resin layer, a protective layer, and a second resin layer over a first mold in this order; providing a second mold over the second resin layer; manufacturing an object including the protective layer inside and an uneven structure on a light incident surface by applying heat and pressure with the first resin layer, the protective layer, and the second resin layer sandwiched between the first mold and the second mold; and forming an opening which surrounds the uneven structure and through which the protective layer is exposed on the light incident surface by irradiating the object with laser light.

One embodiment of the present invention is a method for manufacturing a substrate including the steps of: forming a first resin layer, a protective layer, and a second resin layer over a first mold in this order; providing a second mold over the second resin layer; manufacturing an object including the protective layer inside, a first uneven structure on a light-emitting surface, and a second uneven structure on a light incident surface by applying heat and pressure with the first resin layer, the protective layer, and the second resin layer sandwiched between the first mold and the second mold; and forming an opening which surrounds the second uneven structure and through which the protective layer is exposed on the light incident surface by irradiating the object with laser light.

In the above method for manufacturing a substrate, it is preferable that the first mold be provided over a first elastic material, and then the first resin layer be formed over the first mold. In the above method for manufacturing a substrate, it is preferable that the second mold be provided over the second resin layer and a second elastic material be formed over the second mold. With the use of an elastic material, variation in applied pressure in a surface to which the pressure is applied can be suppressed when the pressure is applied in a later step.

In one embodiment of the present invention, the protective layer is preferably a glass layer with a thickness of greater than or equal to 25 μm and less than or equal to 100 μm. When thin glass is used for the protective layer, moisture, an impurity, or the like can be prevented from entering an organic compound or a metal material contained in the light-emitting element from the outside of the light-emitting device, so that a light-emitting device which is light can be obtained. In particular, when a glass layer with a thickness of greater than or equal to 25 μm and less than or equal to 75 μm is used, a light-emitting device which is light and has high resistance to bending and breaking can be provided.

The above light-emitting device of one embodiment of the present invention can be used in a light-emitting portion of a lighting device.

According to one embodiment of the present invention, a substrate which is light and has high reliability and high light extraction efficiency from an organic EL element can be provided. In addition, a method for manufacturing the substrate can be provided.

A light-emitting device or a lighting device which is light and has high reliability and high light extraction efficiency from an organic EL element can be provided.

BRIEF DESCRIPTION OF THE DRAWINGS

FIGS. 8A to 8C each illustrate an EL layer to which one embodiment of the present invention can be applied.

DETAILED DESCRIPTION OF THE INVENTION

Figure 1A:
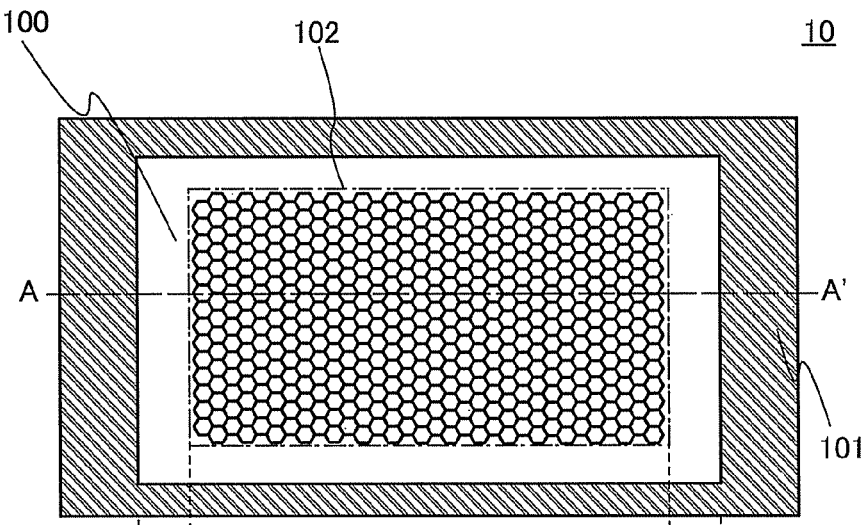
FIGS. 1A to 1D illustrate a substrate and light-emitting devices of one embodiment of the present invention.

Embodiments will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be construed as being limited to the following descriptions of the embodiments. In the structures of the present invention described below, the same portions or portions having similar functions are denoted by the same reference numerals in different drawings, and descriptions thereof will not be repeated.

(Embodiment 1)

In this embodiment, a substrate and a light-emitting device of one embodiment of the present invention are described with reference to FIGS. 1A to 1D, FIGS. 2A to 2C, FIGS. 3A to 3C, FIGS. 4A to 4C, FIGS. 5A to 5C, FIGS. 6A and 6B, and FIGS. 7A to 7D. Note that the light-emitting device in this embodiment has a bottom-emission structure.

STRUCTURAL EXAMPLE 1

Figure 1B:
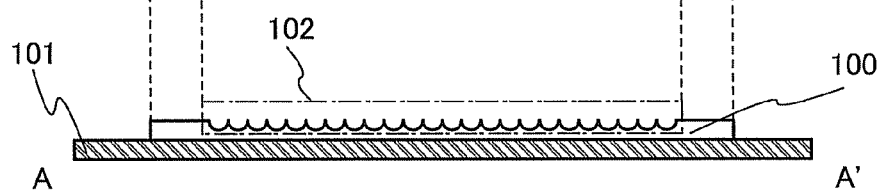
Figure 1C:
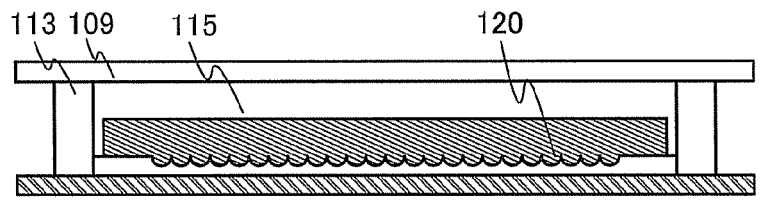

FIG. 1A is a plan view of a substrate which can be used for a light-emitting device of one embodiment of the present invention and FIG. 1B is a cross-sectional view taken along line A-A' in FIG. 1A. FIG. 1C is a cross-sectional view of a light-emitting device of one embodiment of the present invention including a substrate 10 illustrated in FIG. 1A.

As illustrated in FIGS. 1A and 1B, the substrate 10 includes a resin layer 100 provided with an uneven structure 102, over a protective layer 101.

Since a resin material is used for the substrate 10, the light-emitting device can be reduced in weight as compared to the case where a glass substrate is used.

FIG. 1C illustrates the light-emitting device including the substrate 10. The protective layer 101 and a sealing substrate 109 are bonded to each other with a sealant 113, and an organic EL element 120 is included therein over the resin layer 100. In addition, a space 115 exists therein.

The light-emitting device illustrated in FIG. 1C includes an uneven structure between the organic EL element and the resin layer. With such a structure, a reduction in light extraction efficiency due to total reflection at the interface between the organic EL element and the resin layer can be suppressed.

In addition, since the light-emitting device illustrated in FIG. 1C includes the protective layer, entry of moisture, an impurity, or the like to an organic compound or a metal material contained in the organic EL element from the outside of the light-emitting device can be prevented. Further, since a light-emitting element is sealed with the protective layer, the sealing substrate, and the sealant, entry of moisture, an impurity, or the like to the organic compound or the metal material contained in the organic EL element can be prevented not only on a light-emitting surface but also on a side surface of the light-emitting device.

Thus, the light-emitting device illustrated in FIG. 1C, which is one embodiment of the present invention, is light and has high reliability and high light extraction efficiency.

STRUCTURAL EXAMPLE 2

Figure 1D:
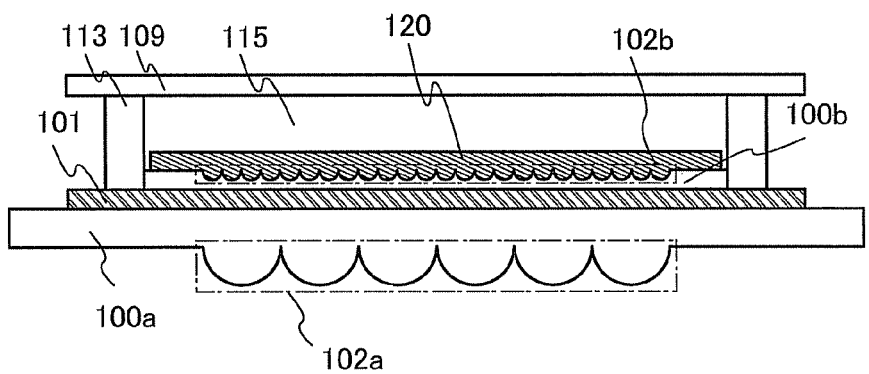

FIG. 1D is a cross-sectional view of a light-emitting device of another embodiment of the present invention.

The light-emitting device illustrated in FIG. 1D includes the protective layer 101 between a pair of resin layers (a first resin layer 100a and a second resin layer 100b). The first resin layer 100a includes a first uneven structure 102a and the second resin layer 100b includes a second uneven structure 102b.

As in Structural Example 1, the protective layer 101 and the sealing substrate 109 are bonded to each other with the sealant 113, and the organic EL element 120 is included therein over the second resin layer 100b. In addition, the space 115 exists therein.

The light-emitting device illustrated in FIG. 1D includes an uneven structure between the organic EL element and the second resin layer. The light-emitting device further includes an uneven structure at the interface between the first resin layer and the air. With such a structure, a reduction in light extraction efficiency due to total reflection at the interface between the organic EL element and the second resin layer and total reflection at the interface between the first resin layer and the air can be suppressed.

The other structures can be similar to those in Structural Example 1.

STRUCTURAL EXAMPLE 3

Figure 7A:
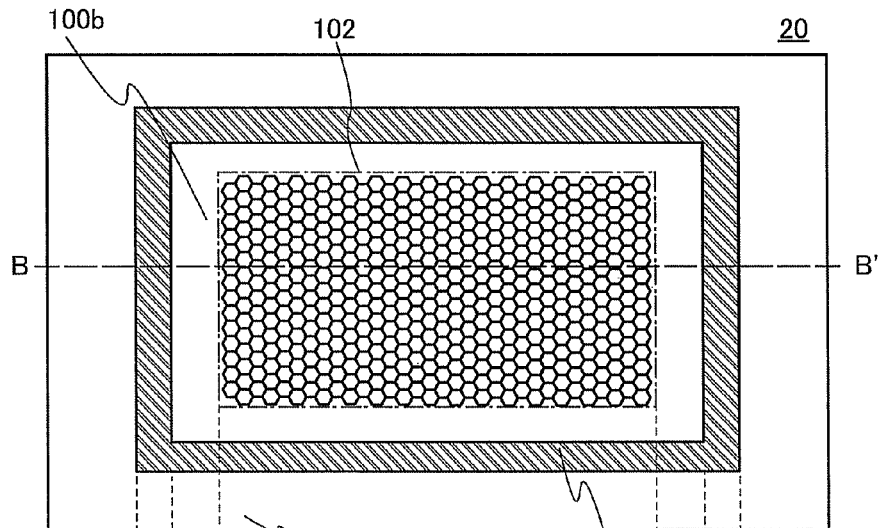
FIGS. 7A to 7D illustrate a substrate and light-emitting devices of one embodiment of the present invention.
Figure 7B:
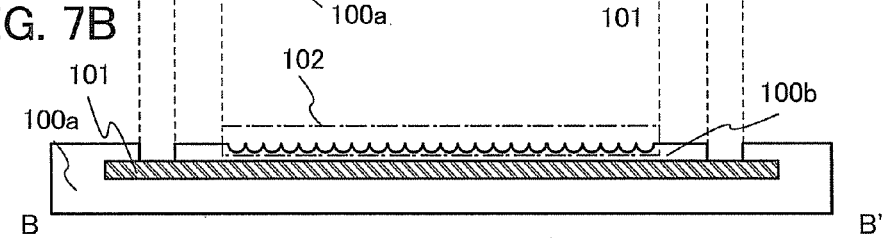
Figure 7C:
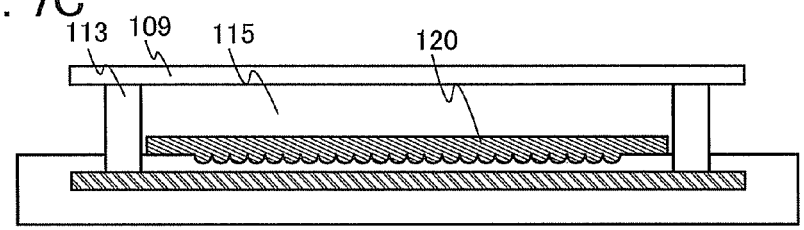

FIG. 7A is a plan view of a substrate which can be used for a light-emitting device of another embodiment of the present invention and FIG. 7B is a cross-sectional view taken along line B-B' in FIG. 7A. FIG. 7C is a cross-sectional view of a light-emitting device of one embodiment of the present invention including a substrate 20 illustrated in FIG. 7A.

As illustrated in FIGS. 7A and 7B, the substrate 20 includes the protective layer 101 in the resin layers 100a and 100b. The resin layer 100b includes the uneven structure 102. The resin layers 100a and 100b are provided with an opening which surrounds the uneven structure 102 and through which the protective layer 101 is exposed.

Since a resin material is used for the substrate 20, the light-emitting device can be reduced in weight as compared to the case where a glass substrate is used.

The protective layer 101 is covered with the resin layers 100a and 100b; therefore, the protective layer 101 and the resin layers 100a and 100b are hardly peeled off. In addition, the mechanical strength of the substrate 20 can be increased.

FIG. 7C illustrates the light-emitting device including the substrate 20. The protective layer 101 and the sealing substrate 109 are bonded to each other with the sealant 113 and the organic EL element 120 is included therein over the resin layer 100b. In addition, the space 115 exists therein.

The light-emitting device illustrated in FIG. 7C includes an uneven structure between the organic EL element and the resin layer. With such a structure, a reduction in light extraction efficiency due to total reflection at the interface between the organic EL element and the resin layer can be suppressed.

In addition, since the light-emitting device illustrated in FIG. 7C includes the protective layer, entry of moisture, an impurity, or the like to an organic compound or a metal material contained in the organic EL element from the outside of the light-emitting device can be prevented.

Further, the resin layer is provided with an opening which surrounds the uneven structure and through which the protective layer is exposed. Since the protective layer and the counter substrate are bonded to each other with the sealant in the opening, entry of moisture, an impurity, or the like to the organic compound or the metal material contained in the organic EL element can be prevented not only on a light-emitting surface but also on a side surface of the light-emitting device.

Since the protective layer in a region other than the opening is covered with the resin layer, the adhesion between the protective layer and the resin layer is high; therefore, a resin which has low adhesion with a material used for the protective layer also can be used.

STRUCTURAL EXAMPLE 4

Figure 7D:
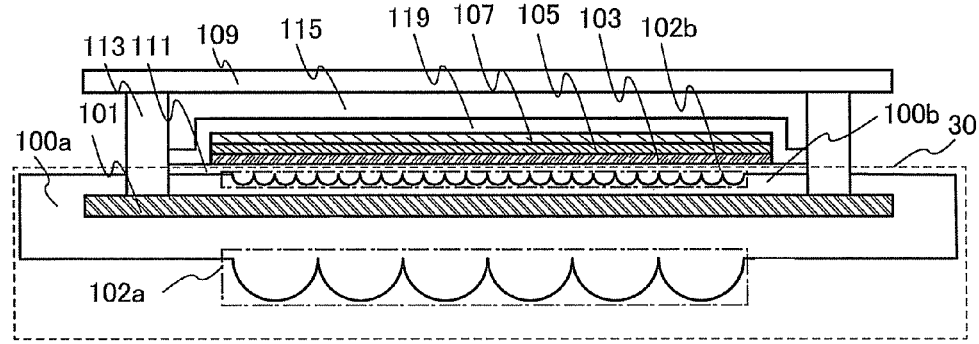

FIG. 7D is a cross-sectional view of a light-emitting device of another embodiment of the present invention. The light-emitting device illustrated in FIG. 7D includes a substrate 30.

The light-emitting device illustrated in FIG. 7D includes the protective layer 101 in the resin layers 100a and 100b. The resin layer 100a includes the first uneven structure 102a on a light emitting surface and the resin layer 100b includes the second uneven structure 102b on a light incident surface. The resin layers 100a and 100b are provided with an opening which surrounds the second uneven structure 102b and through which the protective layer 101 is exposed.

The protective layer 101 and the sealing substrate 109 are bonded to each other with the sealant 113, and therein, a planarization layer 111 is included over the resin layer 100b and an organic EL element (a first electrode 103, an EL layer 105, and a second electrode 107 each having a property of transmitting visible light) is included over the planarization layer 111. Further, the organic EL element is covered with a sealing film 119. Furthermore, the space 115 exists therein.

In the organic EL element used in the light-emitting device, when the first electrode is uneven, leakage current might be generated in the EL layer or the like formed over the first electrode. In one embodiment of the present invention, as the light-emitting device illustrated in FIG. 7D, the light-emitting device preferably includes a planarization layer between the uneven structure and the organic EL element. With such a structure, formation of unevenness over the first electrode due to the uneven structure included in the resin layer can be suppressed and generation of leakage current in the EL layer or the like also can be prevented. Further, the refractive index of the planarization layer is greater than or equal to 1.6, preferably greater than or equal to that of the EL layer. With such a structure, total reflection at the interface between the planarization layer and the first electrode is hardly caused, so that a reduction in light extraction efficiency can be suppressed.

The light-emitting device illustrated in FIG. 7D includes an uneven structure between the planarization layer 111 and the second resin layer 100b. The light-emitting device further includes an uneven structure at the interface between the first resin layer 100a and the air. With such a structure, a reduction in light extraction efficiency due to total reflection at the interface between the planarization layer 111 and the second resin layer 100b and total reflection at the interface between the first resin layer 100a and the air can be suppressed.

By providing the sealing film covering the organic EL element, entry of moisture, an impurity, or the like to an organic compound or a metal material contained in the organic EL element from the outside of the organic EL element can be further suppressed. Therefore, it is preferable to provide the sealing film.

The other structures can be similar to those in Structural Example 3.

Examples of materials which can be used for each layer will be described below.

<Substrates 10, 20, and 30>

The substrate preferably has a high property of transmitting visible light (hereinafter simply referred to as a light-transmitting property). Specifically, the substrate preferably has transmittance of visible light of 85% or higher because high light extraction efficiency can be obtained.

[Resin Layers 100, 100a, and 100b]

As a resin forming the substrate, for example, a polyester resin such as polyethylene terephthalate (PET) or polyethylene naphthalate (PEN), a polyacrylonitrile resin, a polyimide resin, an acrylic (polymethylmethacrylate) resin, a polycarbonate (PC) resin, a polyethersulfone (PES) resin, a polyamide resin, a cyclic olefin-based resin, a cycloolefin resin, a polystyrene resin, a polyamide imide resin, a polyvinylchloride resin, or the like can be used. Alternatively, a resin in which two or more kinds of the above resins are combined may be used. It is preferable to use an acrylic resin because of its high visible light transmittance. A cyclic olefin-based resin and a cycloolefin resin are preferably used because they have high visible light transmittance and high heat resistance.

[Protective Layer 101]

A glass layer with a thickness of greater than or equal to 25 µm and less than or equal to 100 µm is preferably used as the protective layer 101. In particular, when the thickness of the glass layer is greater than or equal to 25 µm and less than or equal to 75 µm, a substrate which is light and has high resistance to bending and breaking can be obtained. Alternatively, a film having a high barrier property against moisture or an impurity may be used.

The protective layer and the resin layer can be bonded to each other with an adhesive or the like. By a manufacturing method according to one embodiment of the present invention, as in Structural Examples 3 and 4, a substrate of one embodiment of the present invention, which includes a protective layer in resin layers, can be easily formed. Specific description will be made in Embodiment 2.

[Uneven Structures 102, 102a, and 102b]

—Material•Manufacturing Method—

The uneven structure can be formed in such a manner that a hemispherical lens, a micro lens array, a film provided with an uneven structure, a light diffusing film, or the like is bonded to a resin layer or a protective layer with an adhesive or the like. The uneven structure is preferably provided in at least a region overlapped with a light-emitting region.

Alternatively, an uneven structure may be formed directly on the resin layer. As a method for forming an uneven structure directly on the resin layer, for example, an etching method, a sand blasting method, a microblast processing method, a droplet discharge method, a printing method (screen printing or offset printing by which a pattern is formed), a coating method such as a spin coating method, a dipping method, a dispenser method, a nano-imprinting method, or the like can be employed as appropriate.

—Uneven Shape—

Figure 11A:
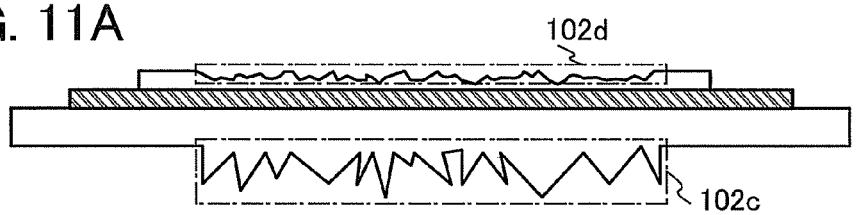
FIGS. 11A to 11C illustrate light-emitting devices of one embodiment of the present invention.

The shape of the unevenness does not necessarily have order of regularity. When the shape of the unevenness is periodic, the unevenness functions as a diffraction grating depends on the size of the unevenness, so that an interference effect is increased and light with a certain wavelength, is easily extracted to the air. For that reason, it is preferable that the shape of the unevenness be not periodic (see uneven structures 102c and 102d in FIG. 11A).

There is no particular limitation on the base shape of the unevenness; for example, the shape may be a polygon such a triangle or a quadrangle, a circle, or the like. When the base shape of the unevenness has order of regularity, the unevenness is preferably provided so that gaps are not formed between adjacent portions of the unevenness. A regular hexagon is given as an example of a preferable base shape.

There is no particular limitation on the shape of the unevenness; for example, a hemisphere or a shape with a vertex such as a circular cone, a pyramid (e.g., a triangular pyramid or a square pyramid), or an umbrella shape can be used.

In the case where the unevenness has order of regularity, it is preferable that the length (pitch) of one cycle of unevenness be set to a length by which the light extraction efficiency can be increased when the substrate and the light-emitting element are combined.

The uneven structure provided between the resin layer and the air preferably has a pitch of greater than or equal to 0.5 mm and less than or equal to 10 cm. Further, a pitch of greater than or equal to 1 mm and less than or equal to 10 mm is more preferable, and a pitch of greater than or equal to 5 mm and less than or equal to 10 mm is still more preferable. This is because manufacture is easily performed and the light extraction efficiency is high. In addition, it is preferable that a peak-to-valley (PV) value of the unevenness be about a half the pitch because the light extraction efficiency can be increased. In this specification, the PV value refers to the height from the valley to the peak of the unevenness.

The uneven structure provided between the organic EL element and the resin layer preferably has a pitch of greater than or equal to 1 µm and less than or equal to 100 µm. A pitch of greater than or equal to 3 µm and less than or equal to 100 µm is particularly preferable. When the uneven structure is too small, light does not follow laws of reflection and refraction, so that the advantageous effect which is the characteristic of one embodiment of the present invention is lost. In addition, the PV value is preferably greater than or equal to 0.1 µm and less than or equal to 100 µm.

Figure 11B:
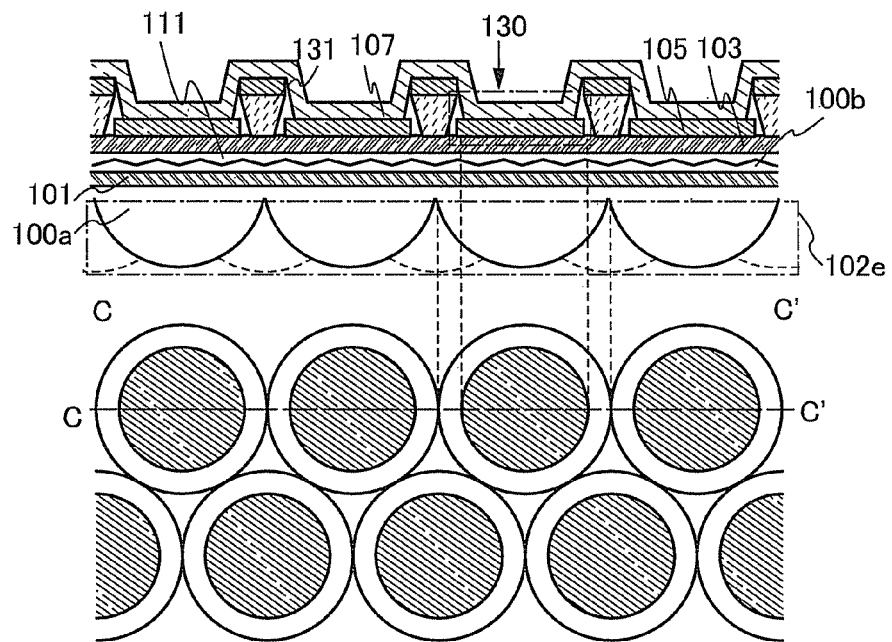
Figure 11C:
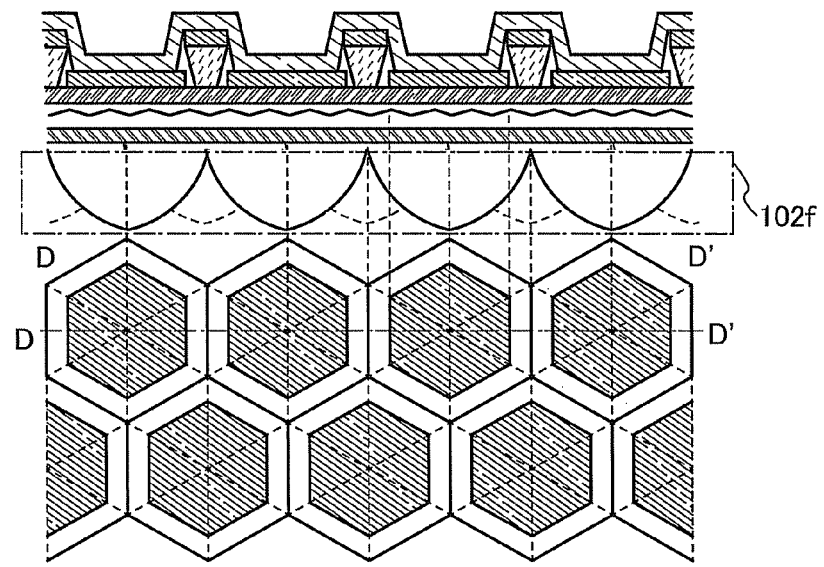

A preferable example of the uneven structure provided between the resin layer and the air is illustrated in FIGS. 11B and 11C. FIGS. 11B and 11C each are a plan view and a cross-sectional view taken along line C-C' (or line D-D') of a light-emitting device. In FIGS. 11B and 11C, the uneven structures 102e and 102f provided between the resin layer and the air have hemispherical shapes. In addition, the organic EL element is provided so that the width of a light-emitting region 130 of the organic EL element is smaller than that of the hemispherical projection and so as to overlap with the hemispherical unevenness. FIG. 11B is an example of a light-emitting device in which the base shape of the uneven structure 102e is a circle. FIG. 11C is an example of a light-emitting device in which the base shape of the uneven structure 102f is a hexagon. Adjacent organic EL elements are separated from each other by a partition 131.

In the case where the unevenness does not have order of regularity, the uneven structure provided between the resin layer and the air preferably has an arithmetic mean deviation (Ra) of greater than or equal to 50 μm and less than or equal to 2 cm. The uneven structure provided between the organic EL element and the resin layer preferably has Ra of greater than or equal to 30 nm and less than or equal to 35 μm.

<Organic EL Element 120>
[First Electrode 103 and Second Electrode 107]

The light-emitting device in this embodiment has a bottom-emission structure. Therefore, the first electrode 103 has a light-transmitting property. The second electrode 107 is provided on the side opposite to the side where light is extracted and has a reflective property.

As the light-transmitting material, indium oxide, indium tin oxide (ITO), indium zinc oxide, zinc oxide, zinc oxide to which gallium is added, graphene, or the like can be used.

In addition, a metal material such as gold, platinum, nickel, tungsten, chromium, molybdenum, iron, cobalt, copper, palladium, or titanium can be used. Further, a nitride of the metal material (such as titanium nitride) or the like may be used. In the case of using the metal material (or the nitride thereof), the first electrode 130 may be thinned so as to have a light-transmitting property.

As the reflective material, a metal material such as aluminum, gold, platinum, silver, nickel, tungsten, chromium, molybdenum, iron, cobalt, copper, or palladium can be used. In addition, any of the following can be used: alloys containing aluminum (aluminum alloys) such as an alloy of aluminum and titanium, an alloy of aluminum and nickel, and an alloy of aluminum and neodymium; and an alloy containing silver such as an alloy of silver and copper. An alloy of silver and copper is preferable because of its high heat resistance. Further, a metal film or a metal oxide film is stacked on an aluminum alloy film, whereby oxidation of the aluminum alloy film can be suppressed. As examples of a material for the metal film or the metal oxide film, titanium, titanium oxide, and the like are given.

[EL Layer 105]

The EL layer 105 includes at least a layer containing a light-emitting organic compound (light-emitting layer). A specific structural example of the EL layer 105 will be described in detail in Embodiment 3.

<Sealing Substrate 109>

As the sealing substrate 109, a glass substrate, a quartz substrate, a metal substrate, or a plastic substrate can be used. A plastic substrate is preferably used because the light-emitting device can be reduced in weight. As a plastic, for example, fiberglass-reinforced plastics (FRP), polyvinyl fluoride (PVF), polyester, acrylic, or the like can be used. As a metal, it is preferable to use a metal such as aluminum, copper, or nickel, a metal alloy such as an aluminum alloy or stainless steel, or the like. With the use of a metal having high thermal conductivity, a light-emitting device having a high heat-dissipation property can be obtained.

<Planarization Layer 111>

Examples of materials for the planarization layer 111 include a liquid, a resin, and the like with a high refractive index. The refractive index of the planarization layer 111 is preferably greater than or equal to 1.6. The planarization layer 111 has a light-transmitting property. Examples of a resin with a high refractive index include a resin containing bromine, a resin containing sulfur, and the like. For example, a sulfur-containing polyimide resin, an episulfide resin, a thiourethane resin, a brominated aromatic resin, or the like can be used. In addition, polyethylene terephthalate (PET), triacetyl cellulose (TAC), or the like can be used. As a liquid with a high refractive index, a contact liquid (refractive liquid) containing sulfur and methylene iodide, or the like can be used. Any of a variety of methods suitable for the material may be employed for forming the planarization layer 111. For example, any of the above resins is deposited by a spin coating method and is cured by heat or light, so that the planarization layer 111 can be formed. The material and the deposition method can be selected as appropriate in consideration of the adhesion strength, ease of processing, or the like.

<Sealant 113>

A known material can be used as the sealant 113. For example, a thermosetting material or a UV curable material may be used. It is preferable to use a material that allows as little moisture or oxygen as possible to penetrate.

In addition, a sealant containing a dry agent can also be used. Two kinds of sealants are preferably used. One of the sealants which does not contain a dry agent is used on the outside (on the air side) and the other of them which contains a dry agent is used on the inside (on the light-emitting element side) so that sealing is performed twice using the sealant containing a dry agent; thus, moisture or oxygen is hardly transmitted.

<Space 115>

The space 115 can be filled with an inert gas (e.g., nitrogen or argon) or a material having low viscosity as a filler. A dry agent may be introduced into the space 115. For example, a substance which absorbs moisture by chemical adsorption, such as an oxide of an alkaline earth metal (e.g., calcium oxide or barium oxide), can be used. Alternatively, a substance which adsorbs moisture by physical adsorption, such as zeolite or silica gel, may be used as the dry agent.

<Sealing Film 119>

The sealing film 119 can be formed using silicon nitride, silicon oxide, alumina, or the like as long as a film which has a high barrier property and in which moisture or an impurity is hardly introduced can be obtained.

This embodiment can be combined with any of the other embodiments as appropriate.

(Embodiment 2)

In this embodiment, a method for manufacturing a substrate of one embodiment of the present invention is described with reference to FIGS. 2A to 2C, FIGS. 3A to 3C, FIGS. 4A to 4C, FIGS. 5A to 5C, and FIGS. 6A and 6B. In this embodiment, an example of manufacturing the substrate 30 using Structural Example 4 (FIG. 7D) in Embodiment 1 is shown.

In this embodiment, a heat press provided with a pair of stages (a lower stage 201a and an upper stage 201b in FIG. 2A) is used. A resin for forming the substrate is heated on the pair of stages through a mold. Since at least one of the pair of stages can move up and down, pressure is applied to the resin by adjusting the distance between the pair of stages. In the case of manufacturing a substrate provided with a minute uneven structure, the substrate may be manufactured under a reduced pressure in order to prevent non-formation of an accurate pattern due to dust or the like.

<Manufacturing Method 1 of Substrate>

Figure 2A:
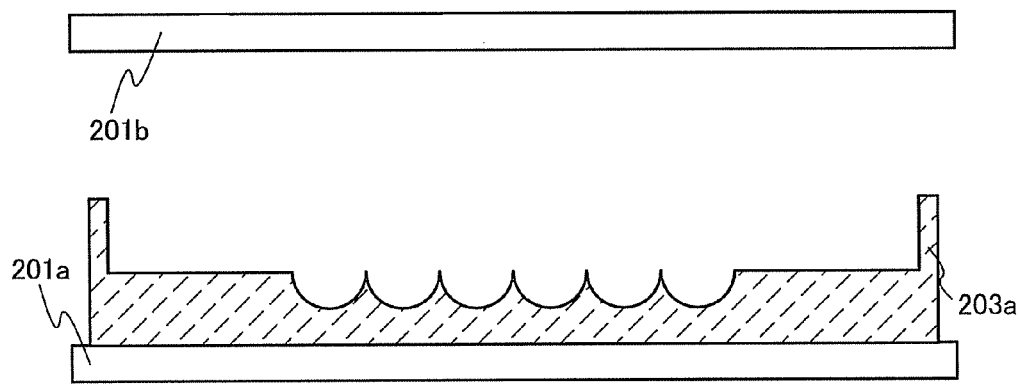
FIGS. 2A to 2C illustrate a method for manufacturing a substrate of one embodiment of the present invention.

First, a first mold 203a is provided over the lower stage 201a (FIG. 2A). In the first mold 203a, a reversed pattern of the first uneven structure 102a is formed.

Note that in a later step of applying pressure, a known elastic material (cushion material) may be provided between the lower stage 201a and the first mold 203a to suppress in-plane variation in pressure.

Figure 2B:
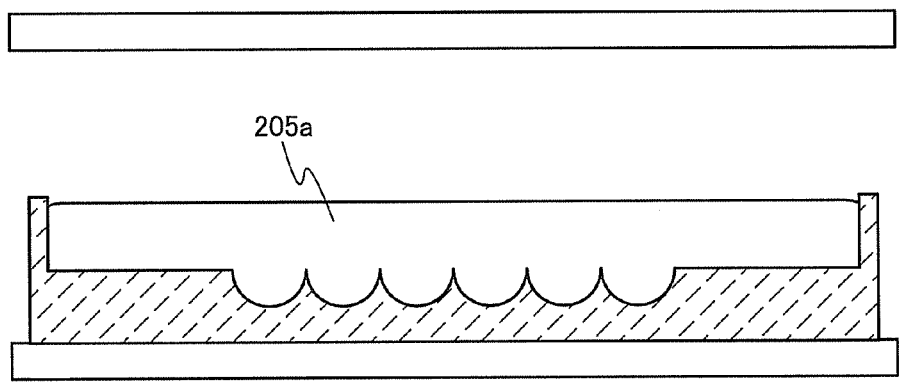

Next, a first resin layer 205a is formed over the first mold 203a (FIG. 2B). There is no particular limitation on the method for forming the first resin layer 205a. For example, the first resin layer 205a can be formed in such a manner that resin pellets are heated and pressure is applied, a resin sheet is used, or a liquid resin is applied.

Figure 2C:
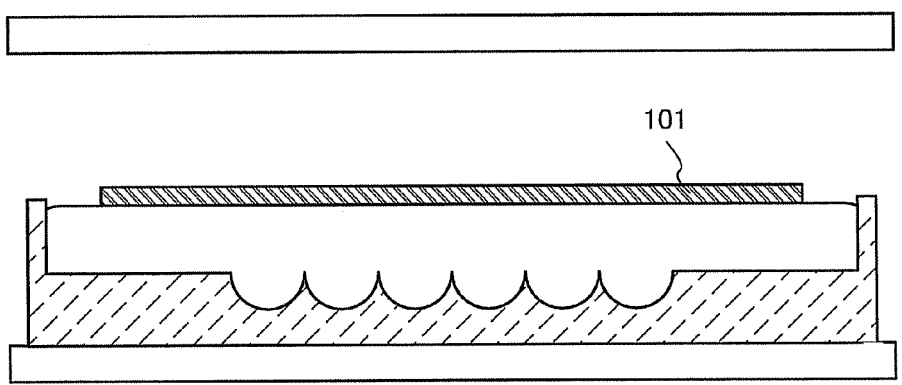

Subsequently, the protective layer 101 is formed over the first resin layer 205a (FIG. 2C). As the protective layer 101, a glass layer with a thickness of greater than or equal to 25 µm and less than or equal to 100 µm is used in this embodiment.

Figure 3A:
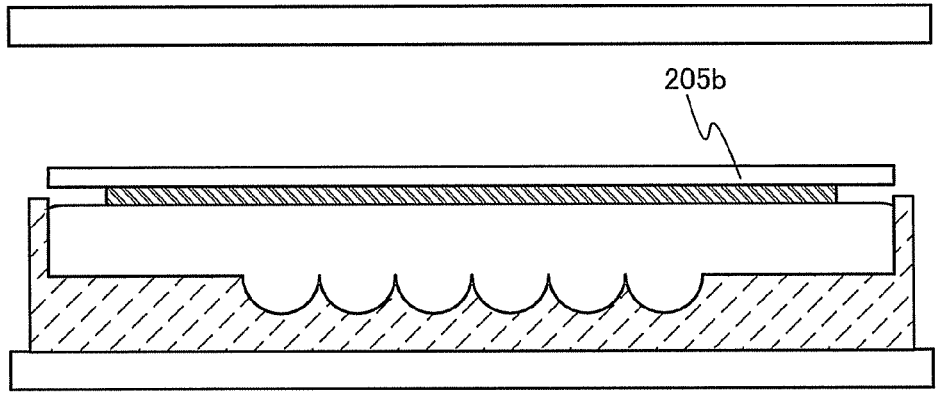
FIGS. 3A to 3C illustrate a method for manufacturing a substrate of one embodiment of the present invention.

After that, a second resin layer 205b is formed over the protective layer 101 (FIG. 3A). The second resin layer 205b can be formed using a method and a material similar to those of the first resin layer 205a.

Figure 3B:
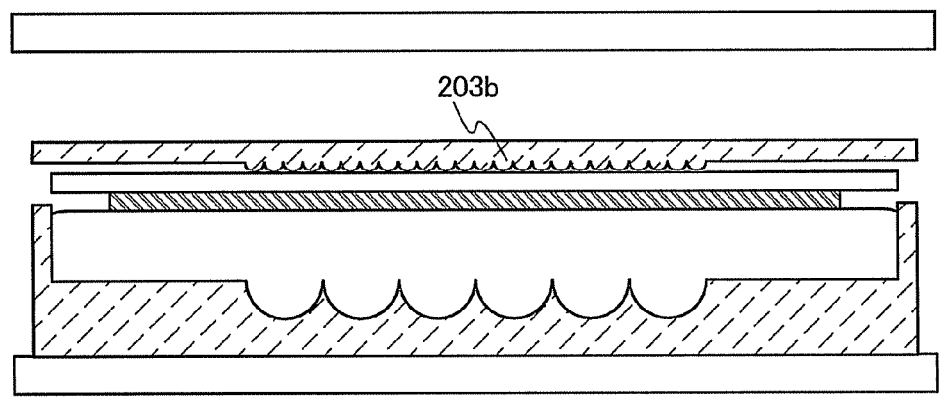

A second mold 203b is provided over the second resin layer 205b (FIG. 3B). In the second mold 203b, a reversed pattern of the second uneven structure 102b is formed.

Note that in the later step of applying pressure, a known elastic material may be provided between the upper stage 201b and the second mold 203b to suppress in-plane variation in pressure.

Figure 3C:
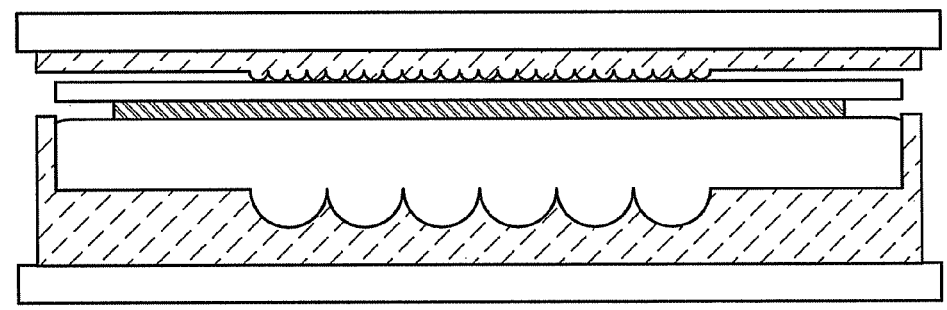

Next, at least one of the lower stage 201a and the upper stage 201b is moved so that the upper stage 201b and the second mold 203b are in contact with each other (FIG. 3C).

Here, if necessary, dehydration baking may be performed on the first resin layer 205a and the second resin layer 205b. In the case of using resin pellets or the like, moisture in the resin layer is removed in advance, so that crack or the like can be suppressed in the substrate to be manufactured.

The temperature and time of the dehydration baking may be determined depending on a resin to be used as appropriate. For example, in the case of using an acrylic resin, it is preferable that heating be performed at 180° C. for approximately 15 minutes.

Figure 4A:
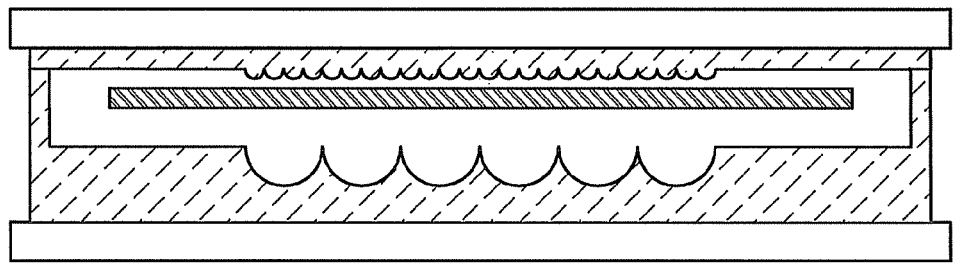
FIGS. 4A to 4C illustrate a method for manufacturing a substrate of one embodiment of the present invention.

Then, molding is performed by heating and applying pressure (FIG. 4A). Note that as in this embodiment, in the case where a glass layer is used as the protective layer 101, applied pressure is adjusted as appropriate so that the glass does not break. In this embodiment, the temperature is 180° C. and a pressure of 3.64 MPa is applied for 10 minutes.

Figure 4B:
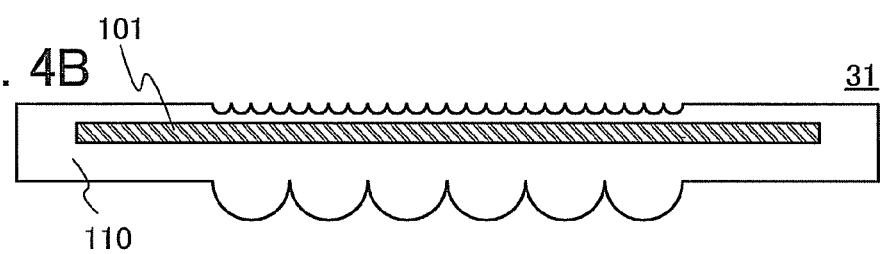
Figure 4C:
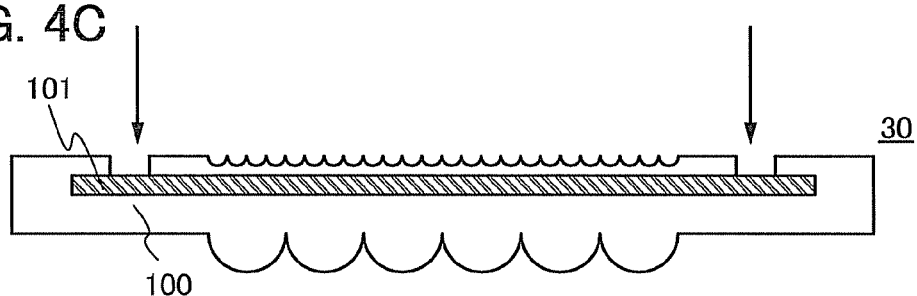

When the molding is completed, a substrate 31 in FIG. 4B can be obtained. The substrate 31 is partly irradiated with laser light, so that an opening which surrounds the second uneven structure 102b is formed (FIG. 4C).

As the laser, an ultraviolet laser can be used, for example. In the case where glass is used for the protective layer, with the use of an ultraviolet laser, the glass is not adversely affected by the laser light; therefore, only the resin can be selectively removed by the laser light. It is preferable that the energy density of the laser beam on the irradiation surface be uniform. Thus, the width of the opening can be precisely controlled. Alternatively, a picosecond laser or a femtosecond laser may be used. Since thermal conduction can be suppressed with the use of a laser with a short pulse width, an opening can be precisely formed even when it has a fine pattern.

Through the above steps, the substrate 30 can be manufactured.

In the above-described manufacturing method, the opening which surrounds the second uneven structure 102b is provided by laser light irradiation. As a means of providing an opening, laser light irradiation is easy. However, when the opening is deep, laser light irradiation for a long time is necessary in some cases.

In a manufacturing method described below, a mold provided with a pattern for forming an opening which surrounds the second uneven structure 102b is used as the second mold. With the use of the mold, the manufacturing time of the substrate can be shortened.

<Manufacturing Method 2 of Substrate>

First, as in the manufacturing method 1 of a substrate, the first mold 203a is provided over the lower stage 201a, the first resin layer 205a is formed over the first mold 203a, the protective layer 101 is formed over the first resin layer 205a, and the second resin layer 205b is formed over the protective layer 101.

Figure 5A:
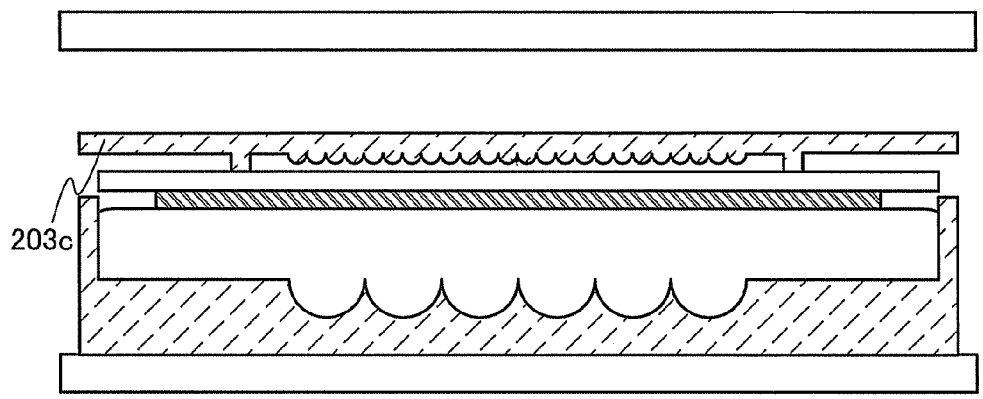
FIGS. 5A to 5C illustrate a method for manufacturing a substrate of one embodiment of the present invention.

A second mold 203c is provided over the second resin layer 205b (FIG. 5A). In the second mold 203c, a reversed pattern of the second uneven structure 102b is formed. A pattern for forming an opening which surrounds the second uneven structure 102b is also formed.

Figure 5B:
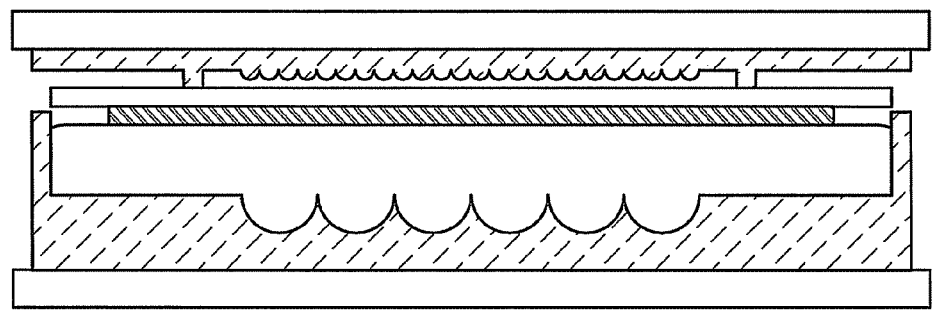

Next, at least one of the lower stage 201a and the upper stage 201b is moved so that the upper stage 201b and the second mold 203c are in contact with each other (FIG. 5B).

Figure 5C:
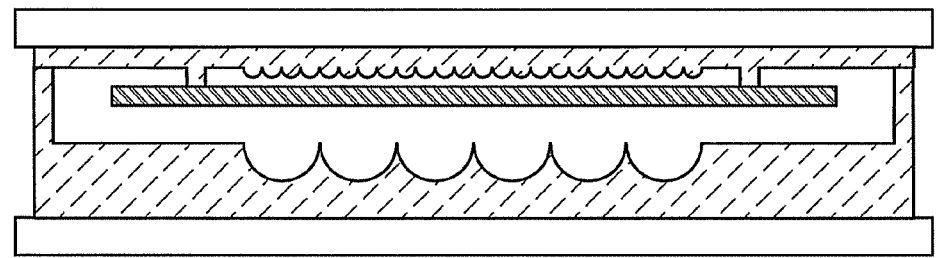

Lastly, molding is performed by heating and applying pressure (FIG. 5C).

Figure 6A:
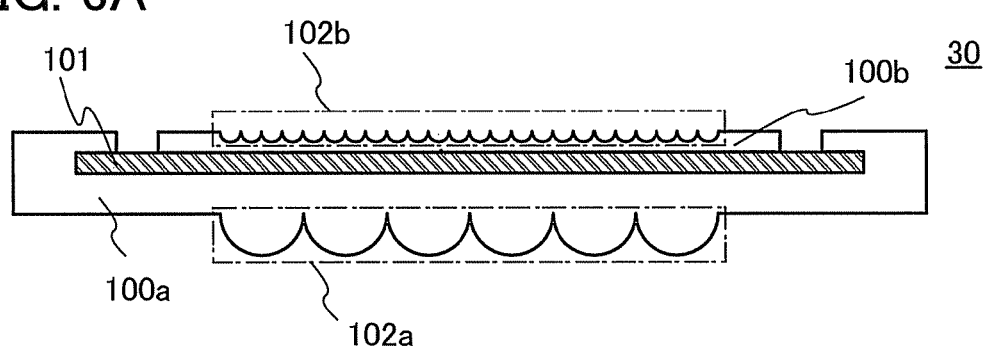
FIGS. 6A and 6B illustrate a method for manufacturing a substrate of one embodiment of the present invention.

Through the above steps, the substrate 30 in FIG. 6A can be manufactured.

Figure 6B:
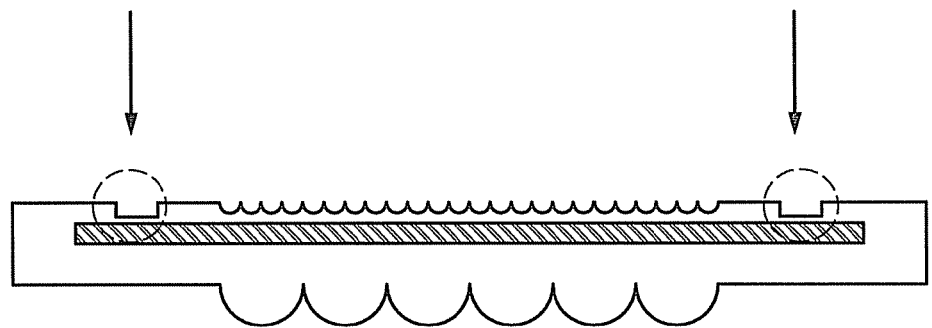

Note that as illustrated in a dotted line portion in FIG. 6B, only by the above manufacturing method, the opening is not completely provided and the protective layer 101 is not exposed in some cases. In that case, the laser light irradiation described above is performed to remove an unnecessary resin, so that the substrate 30 in FIG. 6A can be obtained.

The organic EL element and the sealing film are formed over the substrate 30 in the subsequent steps. The substrate 30 and the sealing substrate are bonded to each other with the sealant, so that a light-emitting device (FIG. 7D) including the substrate 30 of one embodiment of the present invention can be manufactured.

By the manufacturing method in this embodiment, a substrate of one embodiment of the present invention can be easily manufactured. Further, a substrate having high adhesion between the protective layer and the resin layer can be manufactured.

This embodiment can be combined with any of the other embodiments as appropriate.

(Embodiment 3)

In this embodiment, a structural example of an EL layer which can be used for a light-emitting device of one embodiment of the present invention is described with reference to FIGS. 8A to 8C.

In the EL layer 105 in FIG. 8A, a hole injection layer 701, a hole transport layer 702, a light-emitting layer 703, an electron transport layer 704, and an electron injection layer 705 are stacked in this order from the first electrode 103 side.

The hole injection layer 701 is a layer containing a substance having a high hole injection property. As the substance having a high hole injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. A phthalocyanine-based compound such as phthalocyanine (abbreviation: H₂Pc) or copper(II) phthalocyanine (abbreviation: CuPc) may be used.

Further, any of the following aromatic amine compounds which are low molecular organic compounds can be used: 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA 1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Still alternatively, any of high molecular compounds (e.g., oligomers, dendrimers, or polymers) may be used. Examples of the high molecular compound include poly(N-vinylcarbazole) (abbreviation: PVK), poly(-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD). A high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), may be used.

In particular, for the hole injection layer 701, a composite material in which an organic compound having a high hole transport property is mixed with an acceptor substance is preferably used. With the use of the composite material in which a substance having a high hole transport property is mixed with an acceptor substance, excellent hole injection from the first electrode 103 can be obtained, which results in a reduction in driving voltage of the light-emitting element. Such a composite material can be formed by co-evaporation of a substance having a high hole transport property and an acceptor substance. The hole injection layer 701 is formed using the composite material, whereby hole injection from the first electrode 103 to the EL layer 105 is facilitated.

As the organic compound for the composite material, any of a variety of compounds such as aromatic amine compounds, carbazole derivatives, aromatic hydrocarbons, and high molecular compounds (e.g., oligomers, dendrimers, and polymers) can be used. The organic compound used for the composite material is preferably an organic compound having a high hole transport property. Specifically, a substance having a hole mobility of $10^{-6}$ cm²/Vs or higher is preferably used. Note that any other substance may be used as long as the hole transport property thereof is higher than the electron transport property thereof. Specific examples of the organic compound that can be used for the composite material are given below.

Examples of the organic compound that can be used for the composite material include aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP), and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

Further, any of the following aromatic hydrocarbon compounds may be used: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, and the like.

Furthermore, any of the following aromatic hydrocarbon compounds may be used: 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene; tetracene, rubrene, perylene, 2,5,8,11-tetra(tert-butyl)perylene, pentacene, coronene, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Examples of the electron acceptor include organic compounds such as 7,7,8,8-tetracyano-2,3,5,6-tetrafluoroquinodimethane (abbreviation: F₄-TCNQ) and chloranil; and transition metal oxides. Other examples include oxides of metals belonging to Groups 4 to 8 in the periodic table. Specifically, vanadium oxide, niobium oxide, tantalum oxide, chromium oxide, molybdenum oxide, tungsten oxide, manganese oxide, and rhenium oxide are preferable because of their high electron accepting property. Among these, molybdenum oxide is particularly preferable because it is stable in the air, has a low hygroscopic property, and is easily handled.

The composite material may be formed using the above electron acceptor and the above high molecular compound such as PVK, PVTPA, PTPDMA, or Poly-TPD and used for the hole injection layer 701.

The hole transport layer 702 is a layer containing a substance having a high hole transport property. As the substance having a high hole transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances given here are mainly ones that have a hole mobility of $10^{-6}$ cm²/Vs or higher. Note that any other substance may be used as long as the hole transport property thereof is higher than the electron transport property thereof. Note that the layer containing a substance having a high hole transport property is not limited to a single layer and may be formed of a stack of two or more layers containing any of the above substances.

For the hole transport layer 702, a carbazole derivative such as CBP, CzPA, or PCzPA or an anthracene derivative such as t-BuDNA, DNA, or DPAnth may be used.

For the hole transport layer 702, a high molecular compound such as PVK, PVTPA, PTPDMA, or Poly-TPD may be used.

For the light-emitting layer 703, a fluorescent compound that exhibits fluorescence or a phosphorescent compound that exhibits phosphorescence can be used.

The fluorescent compounds that can be used for the light-emitting layer 703 will be given. Examples of a material for blue light emission include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl)triphenylamine (abbreviation: PCBAPA). Further, examples of a material for green light emission include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA). Examples of a material for yellow light emission include rubrene and 5,12-bis(1,1'-biphenyl-4-yl)-6,11-diphenyltetracene (abbreviation: BPT). Examples of a material for red light emission include N,N,N',N'-tetrakis(4-methylphenyl)tetracene-5,11-diamine (abbreviation: p-mPhTD), and 7,14-diphenyl-N,N,N',N'-tetrakis(4-methylphenyl)acenaphtho[1,2-α]fluoranthene-3,10-diamine (abbreviation: p-mPhAFD).

The phosphorescent compounds that can be used for the light-emitting layer 703 will be given. Examples of a material for blue light emission include bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)). Examples of a material for green light emission include tris(2-phenylpyridinato-N,C$^{2'}$)iridium(III) (abbreviation: Ir(ppy)$_3$), bis(2-phenylpyridinato-N,C$^{2'}$)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), and tris(benzo[h]quinolinato)iridium(III) (abbreviation: Ir(bzq)$_3$). Examples of a material for yellow light emission include bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), and (acetylacetonato)bis{2-(4-methoxyphenyl)-3,5-dimethylpyrazinato}iridium(III) (abbreviation: Ir(dmmoppr)$_2$(acac)). Examples of a material for orange light emission include tris(2-phenylquinolinato-N,C$^{2'}$)iridium(III) (abbreviation: Ir(pq)$_3$), bis(2-phenylquinolinato-N,C$^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), and (acetylacetonato)bis(5-isopropyl-3-methyl-2-phenylpyrazinato)iridium(III) (abbreviation: Ir(mppr-iPr)$_2$(acac)). Examples of a material for red light emission include organometallic complexes such as bis[2-(2'-benzo[4,5-α]thienyl)pyridinato-N,C$^{3'}$]iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium(III) (abbreviation: Ir(tppr)$_2$(dpm)), and 2,3,7,8,12,13,17,18-octaethyl-21H,23H-porphyrinplatinum(II) (abbreviation: PtOEP). Further, rare-earth metal complexes, such as tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)), exhibit light emission from rare-earth metal ions (electron transition between different multiplicities), and thus can be used as phosphorescent compounds.

Note that the light-emitting layer 703 may have a structure in which the above light-emitting organic compound (a guest material) is dispersed in another substance (a host material). As a host material, a variety of kinds of materials can be used, and it is preferable to use a substance which has a lowest unoccupied molecular orbital level (LUMO level) higher than that of the light-emitting material and has a highest occupied molecular orbital level (HOMO level) lower than that of the light-emitting material.

Specific examples of the host material include metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), and bathocuproine (abbreviation: BCP); condensed aromatic compounds such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), 9,10-diphenylanthracene (abbreviation: DPAnth), and 6,12-dimethoxy-5,11-diphenylchrysene; and aromatic amine compounds such as N,N-dipheyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, and BSPB.

As the host material, plural kinds of materials can be used. For example, in order to suppress crystallization, a substance such as rubrene which suppresses crystallization may be further added. In addition, NPB, Alq, or the like may be further added in order to efficiently transfer energy to a guest material.

When a structure in which a guest material is dispersed in a host material is employed, crystallization of the light-emitting layer 703 can be suppressed. Further, concentration quenching due to high concentration of the guest material can be suppressed.

For the light-emitting layer 703, a high molecular compound can be used. Specifically, a material for blue light emission, a material for green light emission, and a material for orange to red light emission are given. Examples of a material for blue light emission include poly(9,9-dioctylfluorene-2,7-diyl) (abbreviation: PFO), poly[(9,9-dioctylfluorene-2,7-diyl-co-(2,5-dimethoxybenzene-1,4-diyl)] (abbreviation: PF-DMOP), and poly{(9,9-dioctylfluorene-2,7-diyl)-co-[N,N'-di-(p-butylphenyl)-1,4-diaminobenzene]} (abbreviation: TAB-PFH). Examples of a material for green light emission include poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), and poly[(9,9-dioctyl-2,7-divinylenfluorenylene)-alt-co-(2-methoxy-5-(2-ethylhexyloxy)-1,4-phenylene)]. Examples of a material for orange to red light emission include poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenylamino)-1,4-phenylene]}, and poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD).

Further, when a plurality of light-emitting layers are provided and emission colors of the layers are made different, light emission of a desired color can be obtained from the light-emitting element as a whole. For example, the emission colors of first and second light-emitting layers are complementary in a light-emitting element having the two light-emitting layers, so that the light-emitting element can be made to emit white light as a whole. Note that the word "complementary" means color relationship in which an achromatic color is obtained when colors are mixed. That is, when complementary colored light emitted from substances is mixed, white light emission can be obtained. Further, the same applies to a light-emitting element having three or more light-emitting layers.

The electron transport layer 704 is a layer containing a substance having a high electron transport property. As the substance having a high electron transport property, for example, a metal complex having a quinoline skeleton or a benzoquinoline skeleton, such as Alq, Almq$_3$, BeBq$_2$, or Balq can be used. Alternatively, a metal complex or the like including an oxazole-based or thiazole-based ligand, such as ZnPBO or ZnBTZ, can be used. Other than the metal complexes, PBD, OXD-7, TAZ, BPhen, BCP, or the like may be used. The substances mentioned here are mainly ones that have an electron mobility of $10^{-6}$ cm$^2$V·s or higher. The electron transport layer is not necessarily a single layer and may be formed of a stack including two or more layers containing any of above substances.

The electron injection layer 705 is a layer containing a substance having a high electron injection property. For the electron injection layer 705, an alkali metal, an alkaline earth metal, or a compound thereof, such as lithium, cesium, calcium, lithium fluoride, cesium fluoride, calcium fluoride, or lithium oxide, can be used. Further, a rare earth metal compound such as erbium fluoride may be used. A substance for forming the electron transport layer 704 may be used.

Note that the hole injection layer 701, the hole transport layer 702, the light-emitting layer 703, the electron transport layer 704, and the electron injection layer 705 which are described above can each be formed by an evaporation method (e.g., a vacuum evaporation method), an inkjet method, a coating method, or the like.

As illustrated in FIG. 8B, a plurality of EL layers may be stacked between the first electrode 103 and the second electrode 107. In that case, a charge generation layer 803 is preferably provided between a first EL layer 800 and a second EL layer 801 which are stacked. The charge generation layer 803 can be formed by using the above-mentioned composite material. Further, the charge generation layer 803 may have a stacked structure including a layer containing the composite material and a layer containing another material. In that case, as the layer containing another material, a layer containing an electron donating substance and a substance having a high electron transport property, a layer formed of a transparent conductive film, or the like can be used. As for a light-emitting element having such a structure, problems such as energy transfer and quenching are less likely to occur, and thus a light-emitting element which has both high emission efficiency and long lifetime can be easily obtained due to expansion in the choice of materials. Moreover, a light-emitting element which provides phosphorescence from one of the EL layers and fluorescence from the other can be readily obtained. Note that this structure can be combined with any of the above structures of the EL layer.

Further, by forming EL layers to emit light of different colors from each other, a light-emitting element as a whole can provide light emission of a desired color. For example, the emission colors of first and second EL layers are complementary in a light-emitting element having the two EL layers, so that the light-emitting element can be made to emit white light as a whole. That is, when complementary colored light emitted from substances is mixed, white light emission can be obtained. Further, the same applies to a light-emitting element having three or more EL layers.

As illustrated in FIG. 8C, the EL layer 105 may include the hole injection layer 701, the hole transport layer 702, the light emitting layer 703, the electron transport layer 704, an electron injection buffer layer 706, an electron relay layer 707, and a composite material layer 708 which is in contact with the second electrode 107, between the first electrode 103 and the second electrode 107.

It is preferable to provide the composite material layer 708 which is in contact with the second electrode 107, in which case damage caused to the EL layer 105 particularly when the second electrode 107 is formed by a sputtering method can be reduced. The composite material layer 708 can be formed using the above composite material in which an organic compound having a high hole transport property is mixed with an acceptor substance.

Further, by providing the electron injection buffer layer 706, an injection barrier between the composite material layer 708 and the electron transport layer 704 can be reduced; thus, electrons generated in the composite material layer 708 can be easily injected to the electron transport layer 704.

Any of the following substances having a high electron injection property can be used for the electron injection buffer layer 706: an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), a rare earth metal compound (e.g., an oxide, a halide, and a carbonate)), and the like.

Further, in the case where the electron injection buffer layer 706 contains a substance having a high electron transport property and a donor substance, the donor substance is preferably added so that the mass ratio of the donor substance to the substance having a high electron transport property is from 0.001:1 to 0.1:1. Note that as the donor substance, an organic compound such as tetrathianaphthacene (abbreviation: TTN), nickelocene, or decamethylnickelocene may be used as well as an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), and a rare earth metal compound (e.g., an oxide, a halide, and a carbonate)). Note that as the substance having a high electron transport property, a material similar to the material for the electron transport layer 704 described above can be used.

Furthermore, the electron relay layer 707 is preferably formed between the electron injection buffer layer 706 and the composite material layer 708. The electron relay layer 707 is not necessarily provided; however, by providing the electron relay layer 707 having a high electron transport property, electrons can be rapidly transported to the electron injection buffer layer 706.

The structure in which the electron relay layer 707 is sandwiched between the composite material layer 708 and the electron injection buffer layer 706 is a structure in which the acceptor substance contained in the composite material layer 708 and the donor substance contained in the electron injection buffer layer 706 are less likely to interact with each other, and thus their functions hardly interfere with each other. Accordingly, an increase in driving voltage can be prevented.

The electron relay layer 707 contains a substance having a high electron transport property and is formed so that the LUMO level of the substance having a high electron transport property is located between the LUMO level of the acceptor substance contained in the composite material layer 708 and the LUMO level of the substance having a high electron transport property contained in the electron transport layer 704. In the case where the electron relay layer 707 contains a donor substance, the donor level of the donor substance is controlled so as to be located between the LUMO level of the acceptor substance in the composite material layer 708 and the LUMO level of the substance having a high electron transport property contained in the electron transport layer 704. As a specific value of the energy level, the LUMO level of the substance having a high electron transport property contained in the electron relay layer 707 is preferably greater than or equal to −5.0 eV, more preferably greater than or equal to −5.0 eV and less than or equal to −3.0 eV.

As the substance having a high electron transport property contained in the electron relay layer 707, a phthalocyanine-based material or a metal complex having a metal-oxygen bond and an aromatic ligand is preferably used.

As the phthalocyanine-based material contained in the electron relay layer 707, specifically, any of the following is preferably used: CuPc, a phthalocyanine tin(II) complex (SnPc), a phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc).

As the metal complex having a metal-oxygen bond and an aromatic ligand, which is contained in the electron relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex which has a metal-oxygen double bond is considered stable. Thus, the use of the metal complex having a metal-oxygen double bond makes it possible to drive the light-emitting element at low voltage more stably.

As the metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that as the phthalocyanine-based material described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent; thus, the phthalocyanine derivative has an advantage of being easily handled during formation of a light-emitting element and an advantage of facilitating maintenance of an apparatus used for film formation.

The electron relay layer 707 may further contain a donor substance. Examples of the donor substance include organic compounds such as tetrathianaphthacene (abbreviation: TTN), nickelocene, and decamethylnickelocene, in addition to an alkali metal, an alkaline earth metal, a rare earth metal, and compounds of the above metals (e.g., alkali metal compounds (including an oxide such as lithium oxide, a halide, and carbonates such as lithium carbonate and cesium carbonate), alkaline earth metal compounds (including an oxide, a halide, and a carbonate), and rare earth metal compounds (including an oxide, a halide, and a carbonate)). When such a donor substance is contained in the electron relay layer 707, electrons can be transferred easily and the light-emitting element can be driven at lower voltage.

In the case where a donor substance is contained in the electron relay layer 707, other than the materials described above as the substance having a high electron transport property, a substance having a LUMO level greater than the acceptor level of the acceptor substance contained in the composite material layer 708 may be used. As a specific energy level of the substance having a LUMO level, a LUMO level is greater than or equal to −5.0 eV, preferably greater than or equal to −5.0 eV and less than or equal to −3.0 eV. As examples of such a substance, a perylene derivative and a nitrogen-containing condensed aromatic compound can be given. Note that a nitrogen-containing condensed aromatic compound is preferably used for the electron relay layer 707 because of its stability.

As specific examples of the perylene derivative, the following can be given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), and N,N'-dihexyl-3,4,9,10-perylenetetracarboxylic diimide (abbreviation: Hex PTC).

As specific examples of the nitrogen-containing condensed aromatic compound, the following can be given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), and 2,3-bis(4-fluorophenyl)pyrido[2,3-b]pyrazine (abbreviation: F2PYPR).

Other examples are 7,7,8,8-tetracyanoquinodimethane (abbreviation: TCNQ), 1,4,5,8-naphthalenetetracarboxylic-dianhydride (abbreviation: NTCDA), perfluoropentacene, copper hexadecafluoro phthalocyanine (abbreviation: $F_{16}$CuPc), N,N'-bis(2,2,3,3,4,4,5,5,6,6,7,7,8,8,8-pentadecaf-luorooctyl)-1,4,5,8-naphthalenetetracarboxylic diimide (abbreviation: NTCDI-C8F), 3',4'-dibutyl-5,5''-bis(dicyanom-ethylene)-5,5''-dihydro-2,2':5',2''-terthiophen (abbreviation: DCMT), and methanofullerene (e.g., [6,6]-phenyl $C_{61}$ butyric acid methyl ester).

Note that in the case where a donor substance is contained in the electron relay layer 707, the electron relay layer 707 may be formed by a method such as co-evaporation of the substance having a high electron transport property and the donor substance.

The hole injection layer 701, the hole transport layer 702, the light-emitting layer 703, and the electron transport layer 704 may each be formed using any of the above materials.

As described above, the EL layer 105 of this embodiment can be fabricated.

This embodiment can be freely combined with any of the other embodiments as appropriate.

(Embodiment 4)

In this embodiment, a light-emitting device of another embodiment of the present invention is described with reference to FIGS. 9A and 9B.

In this embodiment, a light-emitting device including the substrate 30 of one embodiment of the present invention which is described in Embodiment 1 is described.

Figure 9A:
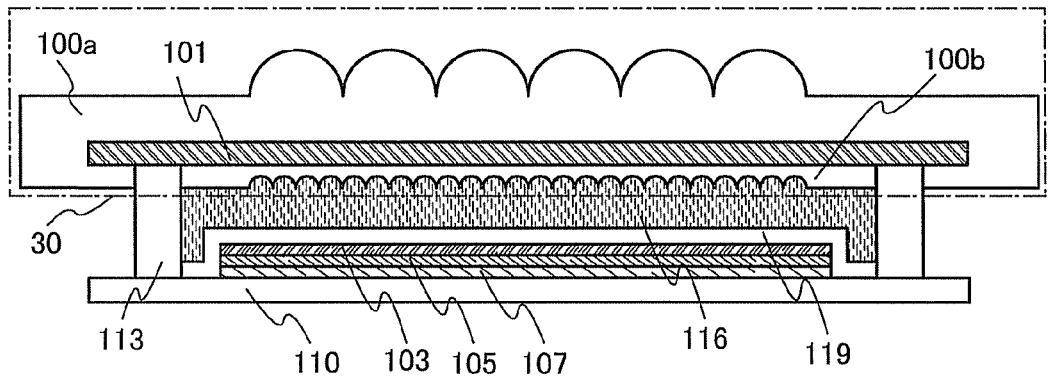
FIGS. 9A and 9B each illustrate a light-emitting device of one embodiment of the present invention.

FIG. 9A shows an example of a light-emitting device having a top-emission structure.

The light-emitting device in FIG. 9A includes an organic EL element (the second electrode 107, the EL layer 105, and the first electrode 103 in this order from the supporting substrate 110 side) over a supporting substrate 110. The organic EL element is covered with the sealing film 119 having a light-transmitting property.

The refractive index of the sealing film 119 used in the light-emitting device in FIG. 9A is greater than or equal to 1.6, preferably greater than or equal to the refractive index of the EL layer. With such a structure, total reflection at the interface between the sealing film and the first electrode is hardly caused, so that a reduction in light extraction efficiency can be suppressed.

The protective layer 101 and the supporting substrate 110 are bonded to each other with the sealant 113, and the organic EL element is included therein. Further, the inside thereof is filled with a filler 116. The refractive index of the filler 116 is greater than or equal to 1.6, preferably greater than or equal to the refractive index of the EL layer. With such a structure, total reflection at the interface between the filler and the sealing film is hardly caused, so that a reduction in light extraction efficiency can be suppressed.

The light-emitting device in FIG. 9A includes an uneven structure between the filler 116 and the substrate 30. In addition, the light-emitting device includes an uneven structure at the interface between the substrate 30 and the air. With such a structure, total reflection at the interface between the filler 116 and the substrate 30 and total reflection at the interface between the substrate 30 and the air are hardly caused, so that a reduction in light extraction efficiency can be suppressed.

The substrate 30, the organic EL element, and the sealant 113 can be manufactured with the materials in Embodiment 1.

For the supporting substrate 110, a material similar to that of the sealing substrate 109 can be used. It is preferable to use a metal substrate having high thermal conductivity as the supporting substrate 110 because a light-emitting device having a high heat-dissipation property can be obtained. The organic EL element may be formed after a base film is provided over the supporting substrate 110.

A material having a light-transmitting property and a high refractive index is used for the filler 116. For example, the resin having a high refractive index which is given as the material of the planarization layer 111 in Embodiment 1 can be used.

Figure 9B:
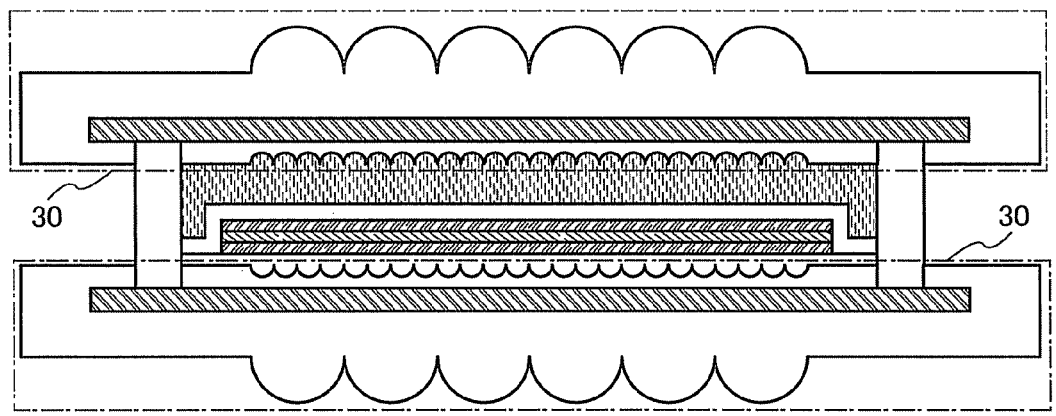

FIG. 9B illustrates an example of a light-emitting device having a dual emission structure.

The light-emitting device in FIG. 9B includes an organic EL element (including an EL layer between a pair of electrodes having a light-transmitting property) over the substrate 30 of one embodiment of the present invention. The organic EL element is covered with a sealing film having a light-transmitting property.

As described above, embodiments of the present invention include light-emitting devices having a top-emission structure and a dual-emission structure. By applying one embodiment of the present invention, a light-emitting device which is light and has high reliability and high light extraction efficiency can be provided.

This embodiment can be combined with any of the other embodiments as appropriate.

(Embodiment 5)

In this embodiment, an example of a lighting device including the light-emitting device of one embodiment of the present invention will be described with reference to FIGS. 10A and 10B.

According to one embodiment of the present invention, a lighting device whose light-emitting portion has a curved surface can be provided.

Further, according to one embodiment of the present invention, a lighting device having a see-through light-emitting portion can be provided.

A lighting device of one embodiment of the present invention can be used for lighting in a car; for example, lighting can be provided for a dashboard, a windshield, a ceiling, or the like.

Figure 10A:
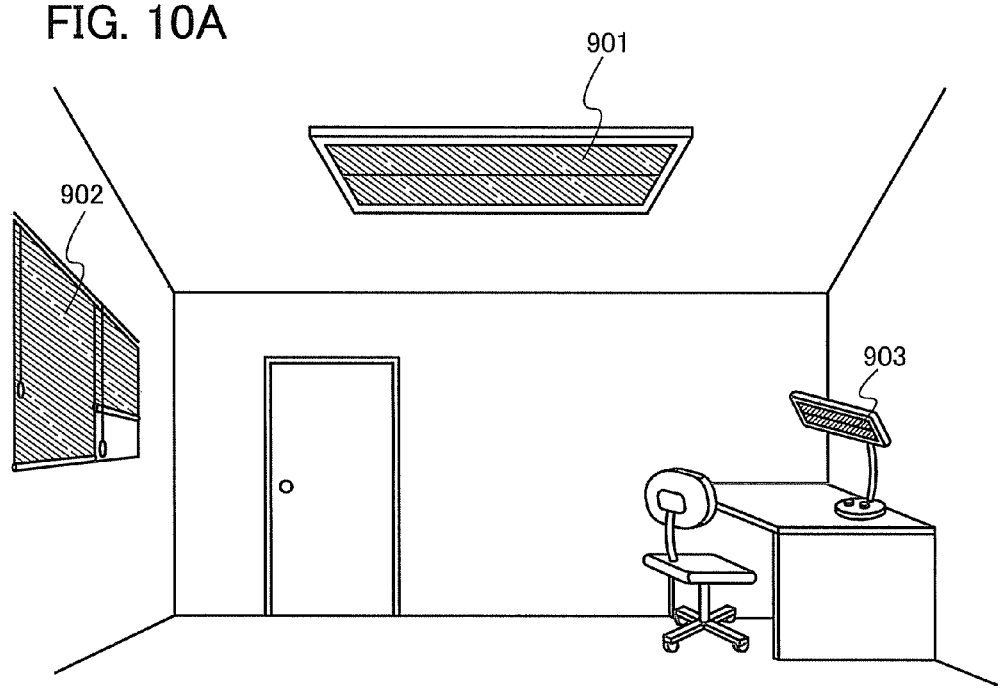
FIGS. 10A and 10B illustrate lighting devices of one embodiment of the present invention.

FIG. 10A illustrates an interior lighting device 901 and a desk lamp 903 to which one embodiment of the present invention is applied. The area of the light-emitting device can be increased, and therefore can be used as a large-area lighting device. Furthermore, the light-emitting device can be used as a roll-type lighting device 902.

Figure 10B:
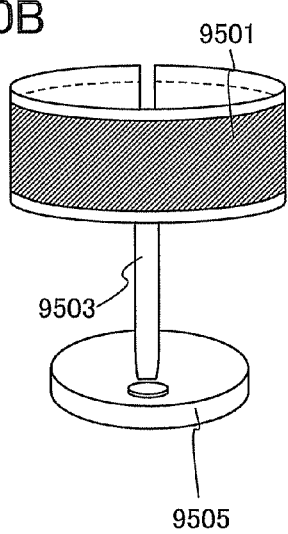

FIG. 10B illustrates another example of the lighting device. A desk lamp illustrated in FIG. 10B includes a lighting portion 9501, a support 9503, a support base 9505, and the like. The lighting portion 9501 includes the light-emitting device of one embodiment of the present invention. As described above, in one embodiment of the present invention, a lighting device having a curved surface or a lighting device having a flexible lighting portion can be provided. The use of a flexible light-emitting device for a lighting device as described above not only improves the degree of freedom in design of the lighting device but also enables the lighting device to be mounted onto a portion having a curved surface, such as the ceiling or a dashboard of a car.

This embodiment can be freely combined with any of the other embodiments.

This application is based on Japanese Patent Application serial no. 2011-047652 filed with Japan Patent Office on Mar. 4, 2011, the entire contents of which are hereby incorporated by reference.

What is claimed is:

1. A light-emitting device comprising:
   a resin layer comprising an uneven structure at a top side of the resin layer;
   a protective layer over the resin layer; and
   a light-emitting element over the protective layer, the light-emitting element comprising a plurality of light-emitting regions which are separated from each other by partitions,
   wherein the uneven structure comprises projections each having a pitch,
   wherein each of the plurality of light-emitting regions overlaps with the projections,
   wherein each width of the plurality of light-emitting regions is smaller than the pitch, and
   wherein the partitions are positioned so as to overlap ends of the projections.

2. The light-emitting device according to claim 1, further comprising:
   a planarization layer over the uneven structure,
   wherein a refractive index of the planarization layer is greater than or equal to 1.6, and
   wherein the light-emitting element is over the planarization layer.

3. A lighting device comprising the light-emitting device according to claim 1 in a light-emitting portion.

4. The light-emitting device according to claim 1, wherein the light-emitting element comprises a light-emitting layer including an organic compound having a light-emitting property.

5. A light-emitting device comprising:
   a first resin layer comprising a first uneven structure at a bottom side of the first resin layer;
   a protective layer over the first resin layer;
   a second resin layer over the protective layer, the second resin layer comprising a second uneven structure at a top side of the second resin layer; and
   a light-emitting element over the second resin layer, the light-emitting element comprising a plurality of light-emitting regions which are separated from each other by partitions,
   wherein the first uneven structure comprises projections each having a pitch,
   wherein each of the plurality of light-emitting regions overlaps with the projections,
   wherein each width of the plurality of light-emitting regions is smaller than the pitch, and
   wherein the partitions are positioned so as to overlap ends of the projections.

6. The light-emitting device according to claim 5, further comprising:
   a planarization layer over the second uneven structure,
   wherein a refractive index of the planarization layer is greater than or equal to 1.6, and
   wherein the light-emitting element is over the planarization layer.

7. A lighting device comprising the light-emitting device according to claim 5 in a light-emitting portion.

8. The light-emitting device according to claim 5, wherein the light-emitting element comprises a light-emitting layer including an organic compound having a light-emitting property.

9. A light-emitting device comprising:
   a substrate;
   a light-emitting element over the substrate, the light-emitting element comprising a plurality of light-emitting regions which are separated from each other by partitions;
   a first resin layer over the light-emitting element,
   the first resin layer comprising a first uneven structure at a bottom side of the first resin layer;
   a protective layer over the first resin layer; and
   a second resin layer over the protective layer, the second resin layer comprising a second uneven structure at a top side of the second resin layer,
   wherein the second uneven structure comprises projections each having a pitch,
   wherein each of the plurality of light-emitting regions overlaps with the projections,
   wherein each width of the plurality of light-emitting regions is smaller than the pitch, and
   wherein the partitions are positioned so as to overlap ends of the projections.

10. The light-emitting device according to claim 9, wherein the light-emitting element comprises a light-emitting layer including an organic compound having a light-emitting property.

11. A lighting device comprising the light-emitting device according to claim 9 in a light-emitting portion.

12. A light-emitting device comprising:
    a first resin layer, the first resin layer comprising a first uneven structure at a bottom side of the first resin layer;
    a first protective layer over the first resin layer;
    a second resin layer over the first protective layer, the second resin layer comprising a second uneven structure at a top side of the second resin layer;
    a light-emitting element over the second resin layer, the light-emitting element comprising a plurality of light-emitting regions which are separated from each other by partitions;
    a third resin layer over the light-emitting element,
    the third resin layer comprising a third uneven structure at a bottom side of the third resin layer;
    a second protective layer over the third resin layer; and
    a fourth resin layer over the second protective layer, the fourth resin layer comprising a fourth uneven structure at a top side of the fourth resin layer,
    wherein each of the first uneven structure and the fourth uneven structure comprises projections each having a pitch,
    wherein each of the plurality of light-emitting regions overlaps with the projections,
    wherein each width of the plurality of light-emitting regions is smaller than the pitch, and
    wherein the partitions are positioned so as to overlap ends of the projections.

13. The light-emitting device according to claim 12, wherein the light-emitting element comprises a light-emitting layer including an organic compound having a light-emitting property.

14. A lighting device comprising the light-emitting device according to claim 12 in a light-emitting portion.

* * * * *